(12) United States Patent
Shikada et al.

(10) Patent No.: US 10,745,802 B2
(45) Date of Patent: Aug. 18, 2020

(54) DIAMOND-COATED CEMENTED CARBIDE CUTTING TOOL

(71) Applicant: MITSUBISHI MATERIALS CORPORATION, Tokyo (JP)

(72) Inventors: Shinichi Shikada, Anpachi-gun (JP); Akimitsu Tominaga, Akashi (JP); Hideaki Takashima, Naka-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/495,629

(22) PCT Filed: Mar. 22, 2018

(86) PCT No.: PCT/JP2018/011328
§ 371 (c)(1),
(2) Date: Sep. 19, 2019

(87) PCT Pub. No.: WO2018/174139
PCT Pub. Date: Sep. 27, 2018

(65) Prior Publication Data
US 2020/0024730 A1    Jan. 23, 2020

(30) Foreign Application Priority Data
Mar. 22, 2017 (JP) ................. 2017-056084

(51) Int. Cl.
*C23C 16/27* (2006.01)
*B23B 27/20* (2006.01)
(Continued)

(52) U.S. Cl.
CPC ............ *C23C 16/27* (2013.01); *B23B 27/148* (2013.01); *B23B 27/20* (2013.01); *B23B 51/00* (2013.01); *B23C 5/16* (2013.01); *C01B 32/949* (2017.08)

(58) Field of Classification Search
CPC ......... C23C 16/27; B23B 27/20; B23B 27/14; B23B 51/00; B23C 5/16
See application file for complete search history.

(56) References Cited

U.S. PATENT DOCUMENTS

| 5,855,974 A | 1/1999 | Wu et al. |
| 2006/0099422 A1 | 5/2006 | Gussone et al. |
| 2014/0231151 A1* | 8/2014 | Matthias ............ B24D 18/0009 175/432 |

FOREIGN PATENT DOCUMENTS

| CN | 1211284 A | 3/1999 |
| CN | 102198523 A | 9/2011 |

(Continued)

OTHER PUBLICATIONS

International Search Report dated May 15, 2018 for the corresponding PCT International Application No. PCT/JP2018/011328.
(Continued)

*Primary Examiner* — Pegah Parvini
(74) *Attorney, Agent, or Firm* — Leason Ellis LLP

(57) ABSTRACT

In this diamond-coated cemented carbide cutting tool, (1) an average particle size of WC particles is 0.5 to 0.9 μm, (2) ($R_z$) being 0.5 to 1.0 μm, a maximum distance between the concave and convex (Δ) is 0.5 to 1.5 μm, a length ($Y_e$) is 0.5 to 2.0 μm, (3) a sum of areas of WC particles, which satisfies ($L_1$) being 0.4 to 0.8 μm, ($L_2$) being 0.2 to 0.4 μm, and ($L_1$)/($L_2$) being 1.5 to 2.5, is 70 area % or more, (4) an average grain size of diamond crystals in a region of 0.5 to 1.5 μm from the body interface is 0.1 to 0.3 μm, and (5) columnar crystals satisfying at least one of: a ratio of crystals, which has a growth direction shifted in 10 degrees or less from the diamond film thickness direction, being 90% or more; or an orientation ratio of <110> being 30 to 70%.

2 Claims, 2 Drawing Sheets

(51) Int. Cl.
*B23C 5/16* (2006.01)
*B23B 27/14* (2006.01)
*B23B 51/00* (2006.01)
*C01B 32/949* (2017.01)

(56) References Cited

FOREIGN PATENT DOCUMENTS

| | | |
|---|---|---|
| CN | 104801941 A | 7/2015 |
| CN | 105671551 A | 6/2016 |
| CN | 105886870 A | 8/2016 |
| CN | 105937021 A | 9/2016 |
| DE | 102006026253 A1 | 12/2007 |
| EP | 1768804 A4 | 9/2010 |
| JP | 06-190609 A | 7/1994 |
| JP | 11-193479 A | 7/1999 |
| JP | 2002-079406 A | 3/2002 |
| JP | 2006-500235 A | 1/2006 |
| JP | 2011-020179 A | 2/2011 |
| JP | 2015-030043 A | 2/2015 |

OTHER PUBLICATIONS

Written Opinion of the International Searching Authority dated May 15, 2018 for the corresponding PCT International Application No. PCT/JP2018/011328.
Chinese Office Action dated Apr. 3, 2020 for the corresponding Chinese Patent Application No. 201880018306.6.

* cited by examiner

DIAMOND-COATED CEMENTED CARBIDE CUTTING TOOL

CROSS-REFERENCE TO RELATED PATENT APPLICATIONS

This application is a U.S. National Phase Application under 35 U.S.C. § 371 of International Patent Application No. PCT/JP2018/011328, filed Mar. 22, 2018, and claims the benefit of priority to Japanese Patent Application No. 2017-056084 filed on Mar. 22, 2017, all of which are incorporated herein by reference in their entirety. The International Application was published in Japanese on Sep. 27, 2018 as International Publication No. WO/2018/174139 under PCT Article 21(2).

FIELD OF THE INVENTION

The present invention relates to a cutting tool made of diamond-coated tungsten carbide (WC)-based cemented carbide which exhibits excellent chipping resistance and peeling resistance by having excellent impact resistance and adhesion in high-speed cutting of a hard-to-cut material such as carbon fiber-reinforced plastic (CFRP) and is thus improved in tool life.

BACKGROUND OF THE INVENTION

In the related art, a cutting tool made of diamond-coated cemented carbide (hereinafter, referred to as "diamond-coated tool") in which a cutting tool body made of WC-based cemented carbide (hereinafter, referred to as "cemented carbide") is coated with a diamond film is known. In order to improve the adhesion between the cutting tool body and the diamond film, various proposals have been made such as forming a diamond film on the cutting tool body.

For example, Japanese Unexamined Patent Application, First Publication No. H11-193479 discloses a cutting tool obtained by coating the surface of a cemented carbide body having concave and convex with a diamond film through an intermediate layer that prevents diffusion of the component of the cemented carbide body.

Furthermore, Japanese Unexamined Patent Application, First Publication No. 2002-79406 discloses that a diamond film is laminated to cause the crystal grain size of the surface to be 2 μm or less in order to perform machining with high surface machining accuracy.

Technical Problem

There has been a strong demand for power saving and energy saving in the technical field of cutting and a further reduction in cost. In accordance with this, there has been a trend toward a further increase in speed during cutting. On the other hand, in a case of using a diamond-coated tool in the related art, for example, for high-speed cutting with high machining accuracy for hard-to-cut materials such as CFRP, a sharp edge tip is required for a drill, and thus particularly high edge tip strength is required. However, the diamond-coated tool in the related art does not have sufficient edge tip strength and is prone to peeling of the diamond film. Therefore, satisfactory chipping resistance and wear resistance cannot be exhibited for long-term usage, and it is difficult to maintain high machining accuracy. As a result, the end of the tool life is reached within a relatively short time in many cases.

Although Japanese Unexamined Patent Application, First Publication No. H11-193479 discloses a tool having a body surface provided with concave and convex and coated with diamond for cutting an aluminum sheet, there is no description about the application to cutting of a hard-to-cut material such as CFRP. When the body surface has large concave and convex, there is a concern of the occurrence of chipping or the surface roughness of the diamond film becomes rough as the diamond film grows. Therefore, it is difficult to immediately apply the technology described in this literature to cutting of a hard-to-cut material such as CFRP.

Moreover, although there is a description about the roughness of a machined surface of a non-ferrous metal such as an aluminum alloy by cutting in Japanese Unexamined Patent Application, First Publication No. 2002-79406, there is no description about the application to a hard-to-cut material such as CFRP. When the proportion of microcrystalline grains of the tool surface diamond is increased, there is a concern of a reduction in wear resistance, and this cannot be immediately applied to a hard-to-cut material such as CFRP.

Therefore, it is desirable to obtain a cutting tool made of diamond-coated WC-based cemented carbide which exhibits excellent chipping resistance and peeling resistance by having excellent impact resistance and adhesion in high-speed cutting of a hard-to-cut material such as CFRP and thus has a long tool life.

Therefore, a technical problem to be solved by the present invention, that is, an object of the present invention is to provide a diamond-coated tool which is improved in chipping resistance and peeling resistance in high-speed cutting of a hard-to-cut material such as CFRP and thus has a long cutting life by improving the adhesion between a diamond film and a cutting tool body in the diamond-coated tool and improving the edge tip strength (impact resistance) of the diamond-coated tool.

SUMMARY OF THE INVENTION

Solution to Problem

In order to solve the above-mentioned problems of the diamond-coated tool in the related art, the present inventors have intensively repeated research and experiments. That is, in end milling of CFRP, a phenomenon in which sudden chipping occurs and the end of the tool life is reached early was analyzed in detail. As a result, it was found that by achieving both smoothness and adhesion of a diamond film, chipping of the diamond film tool is suppressed, peeling resistance is improved, and thus the tool life is extended.

Furthermore, although it is known that a diamond film vapor-phase grown on a cemented carbide body by a hot filament CVD method grows in a columnar shape, a detailed investigation was conducted on the effect of the properties of concave and convex of the body interface contacting with the diamond film on the smoothness of the diamond film. As illustrated in FIG. 1, when the concave and convex of the body interface contacting with the diamond film are large, the crystals of the diamond grains growing in a columnar shape from the body interface collide with the crystals of the adjacent diamond grains in the growth process and grow while including strain, and large concave and convex are generated on the outer surface of the diamond film and greatly impair the smoothness, so that chipping easily occurs.

Therefore, the present inventors conducted further investigations, and as a result, found that in order to cause the properties of the outer surface of the diamond film to be smooth, the size of crystal grains at the initial stage of the growth of the diamond film, and the subsequent growth direction and/or orientation ratio in addition to the properties of the concave and convex of the body interface have an influence.

According to the present invention, by causing the concave and convex of the interface of a cemented carbide body to have predetermined properties, causing the crystal grain size in the initial stage of the growth of a diamond film to be in a predetermined range, and furthermore, causing at least one of the growth direction and orientation ratio of diamond growing subsequently to be in a predetermined range, strain included in the diamond film is reduced, and thus the compatibility between the adhesion of the diamond film to the body and the smoothness thereof is secured. In addition, the peeling resistance of the diamond film is improved by suppressing chipping of a diamond-coated tool, so that the tool life can be extended.

That is, the present invention provides

"(1) A diamond-coated cemented carbide cutting tool in which a WC-based cemented carbide body containing 3 to 15 mass % of Co is coated with a diamond film, in which, in a cross section of the diamond-coated cemented carbide cutting tool in a diamond film thickness direction, (a) an average particle size of WC particles constituting the WC-based cemented carbide body is 0.5 to 0.9 μm, (b) a maximum height difference ($R_z$) of concave and convex of an interface of the WC-based cemented carbide body contacting with the diamond film is 0.5 to 1.0 μm, a maximum distance (Δ) between adjacent concave and convex of the WC-based cemented carbide body at the interface is 0.5 to 1.5 μm, and a length ($Y_e$) of the diamond film in the thickness direction in a region where a binder phase of the WC-based cemented carbide body is removed is 0.5 to 2.0 μm, (c) when a sum of areas occupied by individual WC particles contacting with the diamond film at the interface is defined as 100 area %, a sum of areas of WC particles, which satisfies a maximum value ($L_1$) of vertex-to-vertex distances of the WC particles at a body interface being 0.4 to 0.8 μm, a minimum value ($L_2$) of a diameter of an inscribed-circle inscribed in the WC particle or distances between tangents of opposing faces being 0.2 to 0.4 μm, and ($L_1$)/($L_2$) being 1.5 to 2.5, is 70 area % or more, (d) an average grain size of diamond crystals in a region of 0.5 to 1.5 μm from the WC-based cemented carbide body interface toward the diamond film is 0.1 to 0.3 μm, and (e) the diamond-coated cemented carbide cutting tool comprises columnar crystals, which contact the top of the diamond crystals and constitute the diamond film, the columnar crystals satisfy at least one of: a ratio of crystals, which has a growth direction shifted in 10 degrees or less from the diamond film thickness direction, being 90% or more; or an orientation ratio of <110> being 30 to 70%.

(2) The diamond-coated cemented carbide cutting tool according to (1), in which an average film thickness of the diamond film is 3 to 30 μm."

Advantageous Effects of Invention

The present invention can achieve improvement in the adhesion of the diamond film to the cutting tool body, a reduction in strain included in the diamond film, and furthermore, high smoothness of the outer surface, so that chipping of the diamond-coated cutting tool can be suppressed, and a significant effect of extending the cutting tool life can be exhibited.

DETAILED DESCRIPTION OF THE INVENTION

Figure 1:
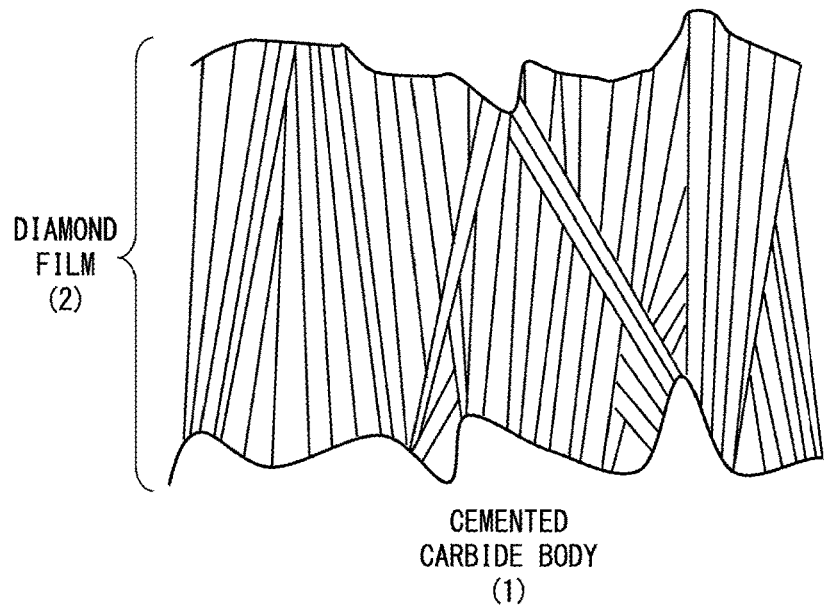
FIG. 1 is a schematic view of a thickness direction cross-section (vertical cross-section) of a diamond film showing that the properties of concave and convex of a cemented carbide body affect the properties of concave and convex of the diamond film.

As described above, the present invention is based on the new finding that by achieving improvement in the adhesion of a diamond film to a cutting tool body, a reduction in strain included therein, and high smoothness of the outer surface thereof, chipping of the diamond film tool can be suppressed, the peeling resistance of the diamond film is improved, and thus the tool life is extended.

Here, the adhesion of the diamond film is achieved by setting, in a WC-based cemented carbide body which is a body, each factor of (1) the Co content, (2) the average particle size of WC particles, (3) the maximum height difference ($R_z$) of the concave and convex of a body interface, (4) the maximum distance (Δ) between adjacent concave and convex of the WC-based cemented carbide body at the interface, (5) the length ($Y_e$) of the diamond film in the thickness direction in a region in which a binder phase of the WC-based cemented carbide body is removed, (6) the maximum value ($L_1$) of vertex-to-vertex distances of the WC particles contacting with the diamond film at the interface, and the diameter of an inscribed-circle inscribed in the WC particle or the minimum distance between the tangents of opposing faces ($L_2$), (7) ($L_1$)/($L_2$), and (8) the area ratio of the WC particles corresponding to (6) and (7) to a predetermined value. On the other hand, the smoothness of the surface of the diamond film is achieved by, in addition to setting the factors that affect the adhesion to the predetermined values, (9) causing the average grain size of diamond crystals in a region of 0.5 to 1.5 μm from the body interface toward the diamond film to be 0.1 to 0.3 μm, and (10) including columnar crystals constituting the diamond film, which contact the top of the diamond crystals (contact the diamond crystals described in (9)), and satisfy at least one of a proportion a ratio of columnar crystals, which has a growth direction shifted in 10 degrees or less from the diamond film thickness direction (the ratio of columnar crystals in which the angle between the growth direction and the thickness direction of the diamond film is 10 degrees or less); being 90% or more; and an orientation ratio of <110> being 30 to 70%.

For this reason, in the present invention, in order to cause the diamond film to obtain predetermined adhesion, while controlling the factors that affect the adhesion, by also considering the influence of the factors that affect the adhesion on the smoothness, the optimum range of each factor is found to achieve improvement in the adhesion, a reduction in strain, and improvement in the smoothness, so that the feature of the invention is to obtain a cutting tool made of diamond-coated cemented carbide in which the occurrence of chipping is suppressed, peeling resistance is improved, and the tool life is long.

Hereinafter, an embodiment of the present invention will be described in detail, including the description of the optimum range of each factor.

1. WC-Based Cemented Carbide Body (Cutting Tool Body)

First, a WC-based cemented carbide body 1 will be described.

(1) Co Content

The WC-based cemented carbide body 1 of the present embodiment contains WC and Co, and the Co content is 3 to 15 mass %. The reason for determining the numerical range of the Co content is as follows. In a case where the Co content in the cemented carbide included in the body 1 is less than 3 mass %, the toughness of the cutting tool body 1 decreases, and fracturing is likely to occur during cutting, which is not preferable. On the other hand, when 15 mass % is exceeded, the volume ratio occupied by voids in a region in which Co is removed after etching increases, and the region in which Co is removed becomes fragile, so that the adhesion between the diamond film and the tool surface decreases, which is not preferable. Therefore, the Co content in the cemented carbide is set to 3 to 15 mass %. The Co content is preferably set in a range of 5 to 7 mass %.

(2) Average Particle Size of WC

The average particle size of WC of the WC-based cemented carbide body 1 of the present embodiment is 0.5 to 0.9 μm. The reason why the average particle size is set to this range is that when the average particle size is less than 0.5 μm, the toughness of the body 1 decreases, and when the average particle size exceeds 0.9 μm, the concave and convex of the body after etching in a pretreatment step become large, which adversely affects the smoothness of a diamond film 2 and easily causes chipping. The average particle size of WC is preferably set in a range of 0.6 to 0.8 μm.

Here, the particle size of WC is the same at any part of the body 1 which has not been subjected to the etching, and is determined as follows. That is, in a cross-section (a cutting plane along the thickness direction of the diamond film 2 (a direction perpendicular to the surface of the diamond film 2)) in a 50-μm square region on the body side separated by 10 μm from the surface of the body 1 (an interface 3 with the diamond film 2), regarding the particle size of individual WC particles 1a which have not been subjected to etching, crystal orientations are measured by electron backscatter diffraction patterns (EBSD) under the condition of a step size of 0.1 μm, a position where the crystal orientations of adjacent measurement points are shirted by 5 degrees is regarded as a grain boundary, and a region surrounded by grain boundaries is regarded as one particle. Then, at each of three random parts in the body cross-section, the number of WC particles 1a included in a 10-μm line segment (overlapping a 10-μm line segment) is counted, 10 μm is divided by the number of WC particles 1a obtained, and the average value of the three obtained numerical values is taken as the average particle size of WC.

(3) Maximum Height Difference of Body Interface

The maximum height difference ($R_z$) of concave and convex of the body surface (maximum value of the concave and convex of the body surface) according to JIS B 0601-1994 obtained by cutting an edge tip, polishing the cross-section of the edge tip (cutting plane along the thickness direction of the diamond film 2) with a cross-sectional polisher (hereinafter, referred to as CP), and observing three 50-μm square regions including the interface 3 between the body 1 and the film 2 with a scanning electron microscope is 0.5 to 1.0 μm. The reason why $R_z$ is set to be in this range is that when $R_z$ is less than 0.5 μm, the anchor effect of the body interface to the diamond film 2 is not sufficient and there is a concern that sufficient adhesion of the diamond film 2 to the body 1 may not be obtained, and when $R_z$ exceeds 1.0 μm, the smoothness of the diamond coating may be adversely affected and chipping may easily occur. The maximum height difference ($R_z$) is preferably set in a range of 0.6 to 0.8 μm.

Figure 3:
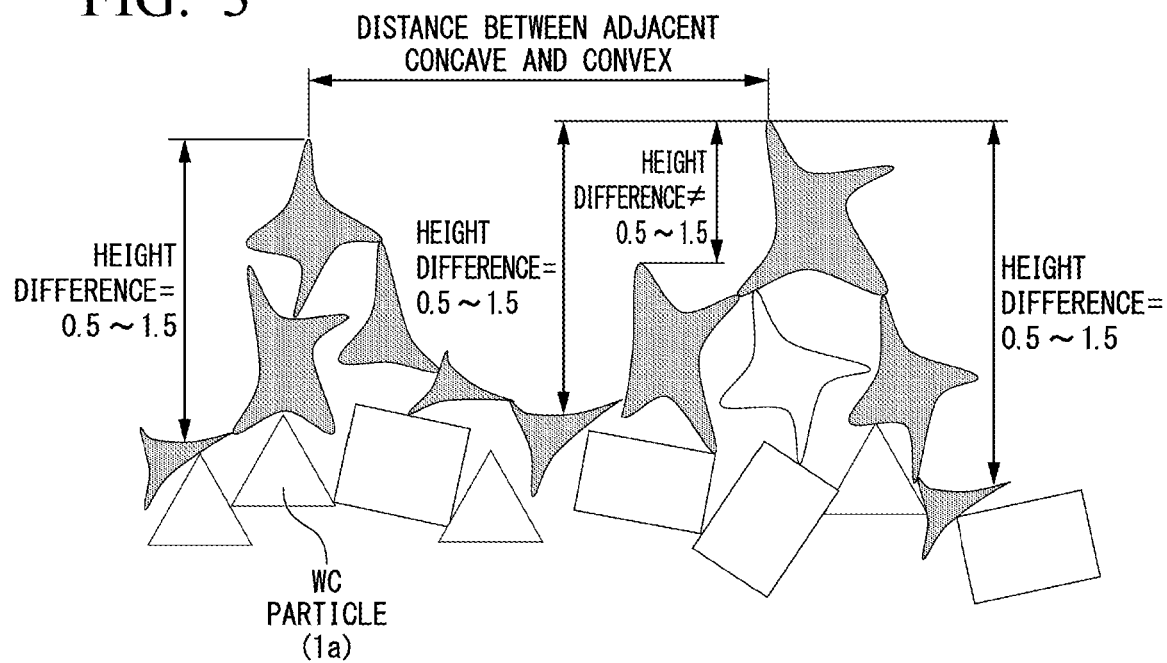
FIG. 3 is a view illustrating the distance between the concave and convex of WC particles at the interface between the diamond film and the WC-based cemented carbide body.

(4) Maximum Value (Maximum Distance Between Concave and Convex) of Distances Between Adjacent Concave and Convex of Body Interface The maximum value ($\Delta$) of the distances between adjacent concave and convex of the body interface (body surface) obtained by cutting an edge tip, polishing the cross-section of the edge tip (cutting plane along the thickness direction of the diamond film) with CP, and observing three 50-μm square regions including the interface 3 between the body 1 and the film 2 with the scanning electron microscope is 0.5 to 1.5 μm. The reason why $\Delta$ is set to be in this range is that when $\Delta$ is less than 0.5 μm, there is a concern that the smoothness of the diamond film 2 may not be secured, and when $\Delta$ exceeds 1.5 μm, the adhesion of the diamond film 2 to the body 1 may become insufficient. $\Delta$ is preferably set in a range of 0.7 to 1.2 μm. $\Delta$ is defined as the distance between concave and convex between which the height difference satisfies a range of 0.5 to 1.5 μm. The distance between the concave and convex is shown in FIG. 3 for reference.

Figure 2:
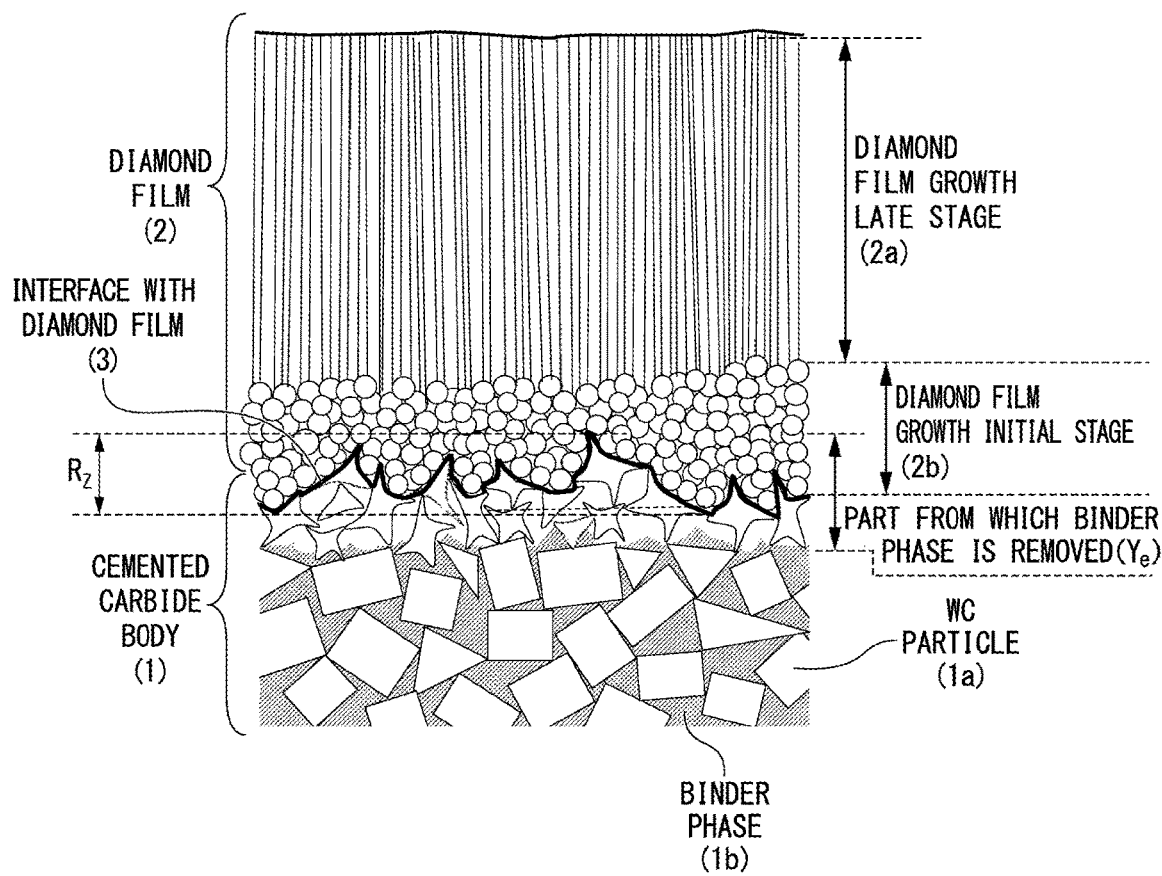
FIG. 2 is an enlarged schematic view of a vertical cross-section of a diamond-coated tool according to an embodiment of the present invention (the scale is not accurate because the view is a schematic view, and in order to emphasize the presence of a binder phase, the area thereof is illustrated larger than its actual size).

(5) Length ($Y_e$) of Diamond Film 2 in the Thickness Direction in Region in Which Binder Phase of Body is Removed In order to form the diamond film 2 on the cemented carbide body 1, it is necessary to remove Co, which is a binder phase component of the cemented carbide body 1, from the interface 3 between the cemented carbide body 1 and the diamond film 2. In a cross-sectional observation image obtained by cutting the edge tip of a diamond-coated tool (diamond-coated tool), polishing the cross-section of the edge tip (cutting plane along the thickness direction of the diamond film) with CP, and observing three 50-μm square regions including the interface 3 between the body 1 and the film 2 with the scanning electron microscope, as illustrated in FIG. 2, the length of the diamond film 2 in the film thickness direction from an uppermost WC particle 1a of the WC body 1 to the deepest bottom of the WC body 1 in the region in which the binder phase 1b of the body 1 is removed by etching with an acid or the like is taken as $Y_e$. In a case where $Y_e$ is less than 0.5 μm, the Co layer is not sufficiently removed from the surface of the cemented carbide body, so that Co diffuses into the interface 3 between the cemented carbide body 1 and the film 2 at the time of diamond deposition, resulting in a reduction in the adhesion of the diamond film 2. In addition, in a case where $Y_e$ exceeds 2.0 μm, the interface 3 between the cemented carbide body 1 and the film 2 becomes fragile, and the body side is easily cracked, which causes peeling. Therefore, the value of $Y_e$ is set to 0.5 to 2.0 μm. The value of $Y_e$ is preferably set in a range of 0.7 to 1.5 μm.

(6) Maximum Value ($L_1$) of Vertex-To-Vertex Distances of WC Particle of Body Interface, and Diameter of Inscribed-circle inscribed in WC Particle of Corresponding Particle or Minimum Value of Distances between Tangents of Opposing Faces ($L_2$)

$L_1$ represents the value of the maximum distance (maximum length) connecting the vertices of the corresponding WC particle 1a, and is 0.4 to 0.8 µm. The maximum length ($L_1$) of the WC particle 1a depends on the particle size of the WC particle 1a, and since WC is eroded by etching, the range thereof is defined in a range not exceeding the WC particle size. When the maximum length does not fall within this range, good adhesion of the diamond film 2 cannot be obtained. $L_1$ is preferably set in a range of 0.5 to 0.7 µm.

On the other hand, $L_2$ is the diameter of the inscribed-circle inscribed in the corresponding WC particle 1a or the minimum value of the distance between the tangents of the opposing faces. $L_2$ is the maximum value of the diameter of the inscribed-circle inscribed in the corresponding WC particle when the number of vertices constituting the cross-sectional shape of the WC particle 1a of the corresponding particle is three. And $L_2$ and is the minimum value of the distance between the tangents of the opposing faces (sides opposing each other in the cross-section) when the number of vertices constituting the cross-sectional shape of the WC particle 1a of the corresponding particle is four. The range of $L_2$ is 0.2 to 0.4 µm. When $L_2$ is less than 0.2 µm, the body strength in the region in which the binder phase 1b of the body 1 is removed cannot be obtained, and a crack tends to occur in the region in which the binder phase 1b of the body 1 is removed. When $L_2$ exceeds 0.4 µm, the anchor effect of the body interface to the diamond film 2 cannot be sufficiently obtained, and there is a concern that sufficient adhesion to the body 1 may not be obtained. $L_2$ is preferably set in a range of 0.25 to 0.35 µm.

Figure 4:
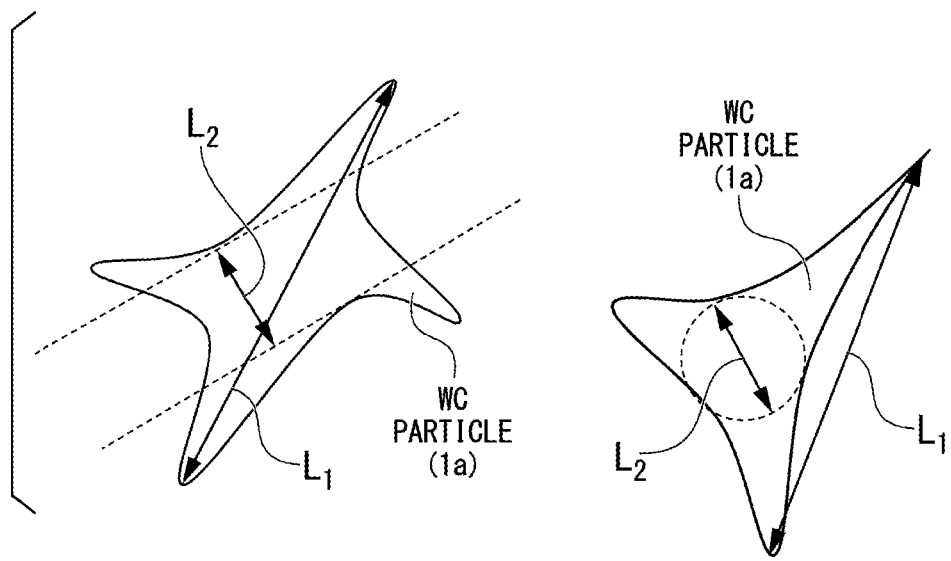
FIG. 4 is a schematic view of the shape of the WC particles in a region in which the binder phase of FIG. 2 is removed, and is a view illustrating the maximum value ($L_1$) of vertex-to-vertex distances of WC particle sizes and the diameter of an inscribed-circle inscribed in the WC particles or the minimum distance between the tangents of opposing faces ($L_2$).

The definition of the maximum value ($L_1$) of the vertex-to-vertex distances of the WC particle 1a and the diameter of the inscribed-circle inscribed in the corresponding WC particle or the minimum value of the distances between the tangents of the opposing faces ($L_2$) is illustrated in FIG. 4 for reference.

(7) Ratio between Maximum Value ($L_1$) of Vertex-To-Vertex Distances of WC Particle at Body Interface and Diameter of Inscribed-circle inscribed in WC Particle of Corresponding Particle or Minimum Value of Distances between Tangents of Opposing Faces ($L_2$)

The ratio ($L_1$)/($L_2$) between the maximum value ($L_1$) of the vertex-to-vertex distances of the WC particles 1a of the body 1 that contact the diamond film 2 and the diameter of the inscribed-circle inscribed in the WC particle 1a of the corresponding particle or the minimum value of the distances between the tangents of the opposing faces ($L_2$) is 1.5 to 2.5. The reason why the ratio is set to be in this range is that when the ratio is less than 1.5, the anchor effect to the diamond film 2 may not be sufficient and sufficient adhesion of the diamond film 2 may not be obtained, and when the ratio exceeds 2.5, there is a concern that the smoothness of the diamond film 2 may be impaired and chipping may easily occur. ($L_1$)/($L_2$) is preferably set in a range of 1.7 to 2.2.

Regarding the maximum value ($L_1$) of the vertex-to-vertex distances of the WC particle 1a at the body interface and the diameter of the inscribed-circle inscribed in the WC particle 1a of the corresponding particle or the minimum value of the distances between the tangents of the opposing faces ($L_2$), in a vertical cross-section (cutting plane along the thickness direction of the diamond film) of the body 1 corresponding to a region of 10 µm from the interface of the body 1 and 50 µm in the direction parallel to the body surface, crystal orientations are measured by electron backscatter diffraction (EBSD) under the condition of a step size of 0.1 µm, a position where the crystal orientations of adjacent measurement points are shifted by 5 degrees is regarded as a grain boundary, a region surrounded by grain boundaries is regarded as one particle of the WC particle 1a, and for all the WC particles 1a in the same vertical cross-section, ($L_1$) and ($L_2$) of the particles in the same vertical cross-section are obtained.

(8) Area Ratio of WC Particles Satisfying (6) and (7)

Regarding the area ratio of WC particles 1a satisfying (6) and (7) described above, in a vertical cross-section (cutting plane along the thickness direction of the diamond film) observation image obtained by observing three 50-µm square regions including the interface 3 between the diamond film 2 and the body 1, when the sum of the areas occupied by individual WC particles 1a that contact the diamond film 2 at the interface 3 is regarded as 100 area %, if the area occupied by the WC particles 1a satisfying (6) and (7) described above among such WC particles 1a is not 70 area % or more, the adhesion and smoothness of the diamond film 2 cannot be obtained even if the regulations (6) and (7) are satisfied. The area ratio is preferably 85 area % or more, and more preferably set in a range of 90 to 100 area %.

2. Diamond Film

Next, the diamond film 2 will be described.

(1) Average Film Thickness of Diamond Film

The average film thickness of the diamond film 2 is the average value of five film thicknesses measured in a region of 50 µm in the horizontal direction to the body surface (direction parallel to the body surface), and the value is desirably set in a range of 3 to 30 µm. By setting the average film thickness to be in this range, sufficient wear resistance and peeling resistance can be further exhibited for long-term usage, and rounding of the edge is more reliably eliminated, so that predetermined machining accuracy can be obtained. The average film thickness of the diamond film 2 is more preferably set in a range of 8 to 18 µm.

(2) Average Grain Size of Diamond Crystals in Region of 0.5 to 1.5 µm from Body Interface Toward Diamond Film In a cross-sectional observation image obtained by cutting the edge tip of a diamond-coated tool, polishing the cross-section of the edge tip (cutting plane along the thickness direction of the diamond film) with CP, and observing three 50-µm square regions including the interface 3 between the body 1 and the film 2 with the scanning electron microscope, the average grain size of the diamond crystals in a region of 0.5 to 1.5 µm from the body interface toward the diamond film 2 along the thickness direction of the diamond film 2, that is, in a growth initial region (diamond film growth initial stage 2b in FIG. 2) of the diamond film 2 is set to 0.1 to 0.3 µm. The average grain size of the diamond crystals is the average value of numerical values obtained by counting the number of diamond crystal grains included in a 3-µm line segment (overlapping a 3-µm line segment) at each of three random parts in the growth initial region observed with angle selective backscattered electrons (ASB), and dividing 3 µm by the obtained number of diamond crystal grains. The reason why the average grain size is set to be in this numerical range is that when the average grain size is less than 0.1 µm, satisfactory adhesion cannot be obtained, and when the average grain size exceeds 0.3 µm, the diamond grains on the outer surface side of the grains do not grow in a columnar shape, that is, in the thickness direction of the diamond film 2. The average grain size of the diamond crystals in the growth initial region of the diamond film 2 is preferably set in a range of 0.15 to 0.25 μm.

(3) In Columnar Crystals Constituting Diamond Film, Ratio of Diamond Crystals in Growth Directions Shifted at Angle of 10 Degrees or Less from Thickness Direction of Diamond Film and <110> Orientation Ratio The crystal structure of the film 2 as illustrated in FIG. 2 can be checked by the structure observation by ASB. The diamond film 2 grows in a columnar shape in a diamond film growth late stage 2a, the growth ratio (hereinafter, aspect ratio) of the crystal grain size in the film thickness direction to that in the horizontal direction exceeds 3, and the aspect ratio increases with the film thickness.

The shift of the growth direction of the crystal grain of the film 2 and the <110> orientation ratio are measured as follows. Regarding the growth direction of the diamond film 2, in a structure observation image of the film 2 obtained by cutting the edge tip of a diamond-coated tool, polishing the cross-section of the edge tip (cutting plane along the thickness direction of the diamond film) with CP, and observing three 30-μm square film cross-sectional regions by ASB, a value obtained by dividing the area occupied by the crystals, in which the shift of the growth direction (the major axis direction of the columnar crystal) of the film 2 from the film thickness direction is 10 degrees or less, by the total area of the film 2 in the measurement region is taken as the ratio of the shift of the angle of 10 degrees or less. In addition, by irradiating individual crystal grains present in the three measurement ranges of the film cross-sectional polished surface perpendicular to the film surface in the 30-μm square film cross-sectional regions with electron beams by EBSD, the inclination angle between the angle formed by the normal to the (110) face of the individual crystal grains of the film 2 and the film thickness direction is measured, and the sum of frequencies where the inclination angle is in a range of 0° to 20° is taken as the <110> orientation ratio. In the columnar crystals constituting the diamond film 2, at least a ratio of diamond crystals, in which the shift in angle of the growth direction measured by the above method from the normal direction of the body 1 (the thickness direction of the diamond film) is 10 degrees or less, 90% or more, or a <110> orientation ratio of 30% to 70%. The reason for this numerical range is that when the ratio of the columnar crystals in which the growth direction is in the thickness direction of the diamond film 2 is less than 90%, the diamond crystals significantly come off during cutting due to strain included in the diamond film 2, and chipping easily occurs. In addition, when the <110> orientation ratio is less than 30%, the wear resistance of the diamond film 2 is insufficient, and when the <110> orientation ratio exceeds 70%, the diamond crystal grains are coarsened, the impact resistance decreases, and chipping easily occurs. However, in a state where the <110> orientation ratio of the film 2 is less than 30% or exceeds 70%, when the area occupied by crystals in which the shift of the growth direction of the film 2 is within 10 degrees exceeds 90%, predetermined cutting performance can be obtained. Furthermore, even in a state where the area occupied by the crystals, in which the shift of the growth direction of the film 2 is 10 degrees or less, does not exceed 90%, when the <110> orientation ratio is 30% or more and 70% or less, predetermined cutting performance can be obtained. Therefore, at least one of the two may be satisfied. The ratio of the columnar crystals, in which the shift of the shift in angle of the growth direction from the thickness direction of the diamond film is 10 degrees or less, is preferably 93% or more, and more preferably 95% or more and 100% or less. The <110> orientation ratio is preferably 40% or more and 60% or less.

EXAMPLES

Next, examples will be described.

Here, a diamond-coated end mill will be described as a specific example of the diamond-coated tool according to the present invention, but the present invention is not limited thereto, and can be applied to various diamond-coated tools such as diamond-coated alloy inserts and diamond-coated drills as a matter of course.

(A) Manufacturing Process of Body

As raw material powders, a WC powder, a Co powder, a TaC powder, and a NbC powder or $Cr_3C_2$ powder having a predetermined average particle size in a range of 0.5 to 0.9 μm were mixed in the ratios shown in Table 1, paraffin as a binder, and toluene, xylene, mesitylene, tetralin, or decalin as a solvent were added, and the mixture was blended in acetone by a ball mill for 24 hours and was decompressed and dried. Thereafter, extrusion press forming was performed to obtain round bar green compacts each having a diameter of 10 mm and a length of 150 mm, and these round bar green compacts were sintered under the sintering condition that the round bar green compacts were held in a vacuum atmosphere at 1 Pa at a temperature of 1380° C. to 1500° C. for one to two hours, whereby sintered bodies were obtained. Thereafter, the sintered bodies were polished to manufacture WC-based cemented carbide sintered bodies.

Next, the WC-based cemented carbide sintered bodies were ground so that a groove-forming portion had an outer diameter dimension of 10 mm and a length of 100 mm, whereby end mill bodies made of WC cemented carbide (hereinafter, simply referred to as "end mill bodies") were manufactured.

(b) Etching Step

Next, etching was performed on the surface of the end mill body in order to form fine concave and convex satisfying the respective numerical ranges of $R_z$, $\Delta$, $L_1$, $L_2$, $(L_1)/(L_2)$, and area %.

The etching was performed in two steps of alkali etching and acid etching. The alkali etching was performed by electrolytic etching, and the acid etching was performed by immersing the body in dilute nitric acid.

Specifically, the following is performed.

(First Pretreatment Step)

Electrolytic etching was performed on the end mill body in 1 L of an etching solution containing NaOH (4 to 8 g) for 10 to 20 minutes in a state where current flows to cause the amount of current per unit area to become 1.5 to 2.5 A/dm², whereby SC on the body surface was removed.

(Second Pretreatment Step)

The end mill body was immersed in 1 L of a solution of dilute nitric acid (0.5 vol %) for 8 to 12 seconds at room temperature (23° C.), whereby a portion of the metal binder phase primarily containing Co near the surface of the drill body was removed by acid etching.

(c) Pretreatment Step for Film Formation of Diamond Film

As a pretreatment for deposition of a diamond film, in order to promote nucleation of diamond at the initial stage of diamond deposition, the end mill body subjected to the above-mentioned etching was subjected to ultrasonication in an ethyl alcohol solution containing a diamond powder having a particle size of 1 μm for 10 minutes.

(d) Deposition Step

The end mill body subjected to the pretreatments was loaded into a hot filament CVD apparatus. The flow rate ratio between hydrogen gas and methane gas was adjusted at a filament temperature of 2050° C. to 2100° C. and a gas pressure of 1 to 3 Torr (133.3 to 399.9 Pa) to maintain the body temperature at 750° C. to 800° C. for a predetermined time (see Table 2), and deposition was performed under initial deposition conditions (for example, from the start of deposition to 300 minutes) such that the grain size of diamond grains in a region of 0.5 to 1.5 μm from the body interface toward the diamond film became 0.1 to 0.3 μm. Thereafter, the flow rate ratio between hydrogen gas and methane gas was adjusted at a filament temperature of 2100° C. to 2150° C. and a gas pressure of 5 to 8 Torr (666.6 to 1066.4 Pa) to maintain the body temperature at 850° C. to 900° C. for a predetermined time (see Table 2), and deposition was performed under deposition conditions (late deposition conditions) such that diamond grew in a columnar shape, whereby diamond film end mills of the present invention (hereinafter, referred to as "present invention end mills") were prepared.

For comparison, raw material powders containing a WC powder having a predetermined average particle size in a range of 0.4 to 1.2 μm were mixed in the proportions shown in Table 1, and in the step described in (a), drill bodies were manufactured. Thereafter, processes of the steps corresponding to (b) to (d) described above (details are shown in Table 2) were performed, whereby diamond film end mills of comparative examples (hereinafter, referred to as "comparative end mills") were prepared.

In Table 2, the "Preceding pretreatment step" is to remove a portion of the binder phase near the body surface in 1 L of a solution of dilute nitric acid (0.5 vol %) for 8 to 15 seconds at room temperature (23° C.), and precedes the first pretreatment step described above. The diagonal lines in Table 2 indicate that the corresponding steps were not performed. Comparative end mill 15 and comparative end mill 18 did not obtain a diamond film.

Table 3 shows the WC particle size, $R_z$, $\Delta$, $Y_e$, $L_1$, $L_2$, and $(L_1)/(L_2)$ of the body, the area % of WC particles, the average film thickness of the diamond film, the grain size in the region of 0.5 to 1.5 μm, the ratio of columnar crystals within 10 degrees, and the <110> orientation ratio in the present invention end mills obtained according to Table 2 and the comparative end mills.

In Table 3, diagonal lines indicate that the corresponding items could not be measured.

TABLE 1

| | Composition of cutting tool body (mass %) | | | | |
| --- | --- | --- | --- | --- | --- |
| Kind | Co | TaC | NbC | $Cr_3C_2$ | WC |
| Body composition A | 3.0 | 0.3 | 0.2 | | Balance |
| Body composition B | 7.0 | | | 0.4 | Balance |
| Body composition C | 5.5 | 0.3 | 0.2 | | Balance |
| Body composition D | 12.0 | 0.4 | 0.4 | | Balance |
| Body composition E | 10.0 | 0.4 | 0.2 | | Balance |
| Body composition F | 15.0 | 0.5 | 0.5 | | Balance |
| Body composition G | 10.0 | 0.6 | 0.2 | | Balance |
| Body composition H | 5.0 | | | 0.3 | Balance |
| Body composition I | 9.0 | 0.3 | 0.5 | | Balance |
| Body composition J | 8.0 | 0.4 | 0.2 | | Balance |
| Body composition K | 17.0* | 0.5 | 0.8 | 0.9 | Balance |
| Body composition L | 2.0* | 0.6 | 0.4 | 0.5 | Balance |

(Note)
*in the columns indicates that the value is not included in the scopes defined by the instant claims.

TABLE 2

| | | Pretreatment conditions | | | | Deposition conditions | | | |
| --- | --- | --- | --- | --- | --- | --- | --- | --- | --- |
| | | Preceding pretreatment | First pretreatment step | | | Second pretreatment | Initial stage | | Late stage | |
| Kind | Body | step Treatment time (sec) | Concentration of alkali solution (M) | Amount of current (A/dm²) | Treatment time (min) | step Treatment time (sec) | Concentration of methane gas with respect to hydrogen gas (vol %) | Deposition time (hr) | Concentration of methane gas with respect to hydrogen gas (vol %) | Deposition time (hr) |
| Present invention end mill 1 | G | | 0.2 | 1.5 | 15 | 8 | 3.0 | 1.5 | 2.0 | 32 |
| Present invention end mill 2 | F | | 0.1 | 1.5 | 10 | 8 | 3.5 | 1.0 | 2.5 | 30 |
| Present invention end mill 3 | C | | 0.2 | 1.5 | 10 | 10 | 3.5 | 1.5 | 2.0 | 37 |
| Present invention end mill 4 | B | | 0.1 | 1.5 | 15 | 10 | 3.5 | 1.0 | 2.0 | 40 |
| Present invention end mill 5 | A | | 0.2 | 1.5 | 15 | 8 | 3.0 | 4.0 | 1.5 | 38 |
| Present invention end mill 6 | H | | 0.2 | 2.0 | 20 | 8 | 3.0 | 3.0 | 1.5 | 36 |
| Present invention end mill 7 | I | | 0.2 | 2.0 | 20 | 8 | 3.5 | 3.5 | 1.5 | 23 |
| Present invention end mill 8 | J | | 0.2 | 2.0 | 20 | 10 | 3.0 | 3.0 | 1.5 | 19 |
| Present invention end mill 9 | C | | 0.2 | 1.5 | 10 | 8 | 3.5 | 3.5 | 1.5 | 25 |
| Present invention end mill 10 | F | | 0.2 | 2.0 | 10 | 10 | 3.5 | 3.5 | 2.0 | 30 |
| Present invention end mill 11 | E | | 0.1 | 1.5 | 15 | 10 | 3.5 | 3.0 | 2.0 | 25 |

TABLE 2-continued

|  |  | Pretreatment conditions | | | | Deposition conditions | | | |
|---|---|---|---|---|---|---|---|---|---|
|  |  | Preceding pretreatment step | First pretreatment step | | | Second pretreatment step | Initial stage | | Late stage | |
| Kind | Body | Treatment time (sec) | Concentration of alkali solution (M) | Amount of current (A/dm$^2$) | Treatment time (min) | Treatment time (sec) | Concentration of methane gas with respect to hydrogen gas (vol %) | Deposition time (hr) | Concentration of methane gas with respect to hydrogen gas (vol %) | Deposition time (hr) |
| Present invention end mill 12 | J |  | 0.2 | 1.5 | 15 | 10 | 3.0 | 3.5 | 1.5 | 60 |
| Present invention end mill 13 | D |  | 0.1 | 2.0 | 20 | 8 | 2.5 | 3.0 | 2.0 | 30 |
| Present invention end mill 14 | G |  | 0.2 | 1.5 | 10 | 10 | 3.0 | 3.5 | 1.5 | 25 |
| Present invention end mill 15 | A |  | 0.1 | 2.0 | 15 | 10 | 3.5 | 3.5 | 2.0 | 30 |
| Present invention end mill 16 | I |  | 0.2 | 1.5 | 15 | 8 | 3.0 | 2.0 | 1.5 | 6 |
| Present invention end mill 17 | H |  | 0.2 | 2.0 | 15 | 8 | 3.0 | 2.0 | 2.0 | 25 |
| Present invention end mill 18 | B |  | 0.2 | 2.0 | 20 | 10 | 3.5 | 2.0 | 1.5 | 15 |
| Present invention end mill 19 | F |  | 0.2 | 1.5 | 15 | 8 | 2.5 | 2.0 | 2.0 | 4 |
| Present invention end mill 20 | H |  | 0.2 | 2.0 | 20 | 10 | 2.5 | 3.0 | 1.5 | 70 |
| Comparative end mill 1 | D |  | 0.2 | 2.0 | 20 | 3 | 2.0 | 3.0 | 2.0 | 30 |
| Comparative end mill 2 | G |  | 0.2 | 2.0 | 15 | 20 | 2.0 | 4.0 | 1.5 | 50 |
| Comparative end mill 3 | A |  | 0.1 | 1.5 | 5 | 5 | 3.5 | 4.0 | 2.0 | 30 |
| Comparative end mill 4 | E |  | 0.2 | 1.5 | 30 | 8 | 2.0 | 3.0 | 1.5 | 25 |
| Comparative end mill 5 | B |  | 0.2 | 1.0 | 30 | 8 | 2.5 | 4.0 | 2.0 | 20 |
| Comparative end mill 6 | F |  | 0.2 | 3.0 | 10 | 10 | 2.5 | 4.0 | 1.5 | 15 |
| Comparative end mill 7 | H |  | 0.05 | 1.5 | 15 | 8 | 2.0 | 3.0 | 2.0 | 10 |
| Comparative end mill 8 | C |  | 0.3 | 1.5 | 20 | 10 | 3.5 | 3.0 | 2.0 | 20 |
| Comparative end mill 9 | J |  | 0.2 | 2.0 | 15 | 8 | 3.0 | 4.0 | 1.5 | 30 |
| Comparative end mill 10 | I |  | 0.2 | 1.5 | 20 | 10 | 2.5 | 4.0 | 2.0 | 20 |
| Comparative end mill 11 | K* |  | 0.2 | 2.0 | 15 | 8 | 2.0 | 4.0 | 1.5 | 20 |
| Comparative end mill 12 | L* |  | 0.2 | 1.5 | 20 | 10 | 2.0 | 3.0 | 2.0 | 30 |
| Comparative end mill 13 | B |  | 0.2 | 1.0 | 20 | 10 | 3.0 | 3.0 | 2.0 | 30 |
| Comparative end mill 14 | C |  | 0.2 | 1.0 | 3 | 10 | 2.5 | 3.0 | 1.5 | 25 |
| Comparative end mill 15 | A |  | 0.2 | 1.5 | 20 |  | 2.5 | 4.0 | 2.0 | 20 |
| Comparative end mill 16 | G | 8 |  |  |  |  | 2.0 | 4.0 | 2.0 | 40 |
| Comparative end mill 17 | E |  |  |  |  | 10 | 3.0 | 4.0 | 1.5 | 20 |
| Comparative end mill 18 | C |  |  |  |  |  | 2.0 | 4.0 | 1.5 | 20 |
| Comparative end mill 19 | J | 10 | 0.2 | 2.0 | 15 | 10 | 2.5 | 3.0 | 2.0 | 20 |
| Comparative end mill 20 | E | 15 | 0.2 | 1.5 | 15 | 10 | 2.0 | 3.0 | 1.5 | 30 |
| Comparative end mill 21 | C | 6 | 0.2 | 2.0 | 20 | 10 | 2.5 | 3.0 | 2.0 | 20 |
| Comparative end mill 22 | I | 5 | 0.2 | 1.5 | 20 | 10 | 2.5 | 3.5 | 1.5 | 30 |
| Comparative end mill 23 | C |  | 0.2 | 1.5 | 15 | 10 | 4.0 | 3.0 | 2.0 | 20 |

TABLE 2-continued

| | | Pretreatment conditions | | | | Deposition conditions | | | |
| --- | --- | --- | --- | --- | --- | --- | --- | --- | --- |
| | | | | | | Initial stage | | Late stage | |
| | | Preceding pretreatment | First pretreatment step | | | Second pretreatment | Concentration of methane | | Concentration of methane | |
| Kind | Body | step Treatment time (sec) | Concentration of alkali solution (M) | Amount of current (A/dm²) | Treatment time (min) | step Treatment time (sec) | gas with respect to hydrogen gas (vol %) | Deposition time (hr) | gas with respect to hydrogen gas (vol %) | Deposition time (hr) |
| Comparative end mill 24 | A | | 0.2 | 2.0 | 20 | 10 | 1.0 | 3.0 | 1.5 | 20 |
| Comparative end mill 25 | C | | 0.2 | 2.0 | 20 | 10 | 0 | 0 | 1.0 | 50 |

(Note)
*in the columns indicates that the value is not included in the scopes defined by the instant claims.

TABLE 3

| | Body | | | | | | | |
| --- | --- | --- | --- | --- | --- | --- | --- | --- |
| Kind | WC average particle size (μm) | $R_s$ (μm) | $\Delta$ (μm) | $Y_a$ (μm) | $L_1$ (μm) | $L_2$ (μm) | $(L_1/L_2)$ | Area ratio of WC particles simultaneously satisfying three left columns (%) |
| Present invention end mill 1 | 0.6 | 0.5 | 0.6 | 0.8 | 0.5 | 0.3 | 1.7 | 80 |
| Present invention end mill 2 | 0.5 | 0.6 | 0.5 | 1.5 | 0.4 | 0.2 | 2.0 | 90 |
| Present invention end mill 3 | 0.5 | 0.6 | 0.6 | 1.2 | 0.4 | 0.2 | 2.0 | 90 |
| Present invention end mill 4 | 0.6 | 0.5 | 0.8 | 0.9 | 0.5 | 0.2 | 2.5 | 90 |
| Present invention end mill 5 | 0.7 | 0.6 | 0.6 | 0.6 | 0.6 | 0.3 | 2.0 | 90 |
| Present invention end mill 6 | 0.9 | 1.0 | 0.9 | 0.9 | 0.7 | 0.4 | 1.8 | 80 |
| Present invention end mill 7 | 0.8 | 0.9 | 1.1 | 0.8 | 0.7 | 0.3 | 2.3 | 80 |
| Present invention end mill 8 | 0.9 | 0.9 | 1.2 | 1.2 | 0.8 | 0.4 | 2.0 | 80 |
| Present invention end mill 9 | 0.6 | 0.5 | 0.5 | 0.6 | 0.5 | 0.2 | 2.5 | 90 |
| Present invention end mill 10 | 0.7 | 0.8 | 0.8 | 1.0 | 0.6 | 0.3 | 2.0 | 80 |
| Present invention end mill 11 | 0.9 | 1.0 | 1.0 | 1.0 | 0.8 | 0.4 | 2.0 | 80 |
| Present invention end mill 12 | 0.6 | 0.7 | 0.7 | 0.8 | 0.5 | 0.2 | 2.5 | 80 |
| Present invention end mill 13 | 0.7 | 0.8 | 0.9 | 1.0 | 0.6 | 0.3 | 2.0 | 80 |
| Present invention end mill 14 | 0.6 | 0.6 | 0.6 | 0.7 | 0.5 | 0.2 | 2.5 | 80 |
| Present invention end mill 15 | 0.7 | 0.7 | 0.8 | 0.9 | 0.6 | 0.3 | 2.0 | 70 |
| Present invention end mill 16 | 0.5 | 0.6 | 0.7 | 0.8 | 0.4 | 0.2 | 2.0 | 80 |
| Present invention end mill 17 | 0.6 | 0.6 | 0.6 | 0.7 | 0.5 | 0.2 | 2.5 | 90 |
| Present invention end mill 18 | 0.7 | 0.8 | 0.9 | 1.0 | 0.6 | 0.3 | 2.0 | 90 |
| Present invention end mill 19 | 0.6 | 0.7 | 0.7 | 0.8 | 0.5 | 0.2 | 2.5 | 90 |
| Present invention end mill 20 | 0.6 | 0.7 | 0.7 | 1.5 | 0.5 | 0.2 | 2.5 | 80 |
| Comparative end mill 1 | 0.6 | 1.5* | 0.6 | 0.3* | 0.5 | 0.2 | 2.5 | 80 |
| Comparative end mill 2 | 0.5 | 1.3* | 0.4 | 2.5* | 0.4 | 0.2 | 2.0 | 80 |
| Comparative end mill 3 | 0.5 | 0.2* | 0.5 | 0.5 | 0.4 | 0.2 | 2.0 | 70 |
| Comparative end mill 4 | 0.6 | 2.0* | 0.6 | 0.8 | 0.5 | 0.2 | 2.5 | 50* |
| Comparative end mill 5 | 0.6 | 0.3* | 0.7 | 0.8 | 0.5 | 0.2 | 2.5 | 80 |
| Comparative end mill 6 | 0.5 | 1.8* | 0.5 | 1.2 | 0.4 | 0.2 | 2.0 | 30* |
| Comparative end mill 7 | 0.6 | 0.3* | 0.7 | 0.8 | 0.5 | 0.2 | 2.5 | 80 |
| Comparative end mill 8 | 0.6 | 1.6* | 0.6 | 1.5 | 0.5 | 0.2 | 2.5 | 90 |
| Comparative end mill 9 | 1.3* | 2.0* | 1.6* | 0.8 | 1.2* | 0.3 | 4.0* | 80 |
| Comparative end mill 10 | 0.4* | 0.3* | 0.3* | 1.5 | 0.3* | 0.3 | 1.0* | 90 |
| Comparative end mill 11 | 0.7 | 0.6 | 0.5 | 0.8 | 0.6 | 0.3 | 2.0 | 80 |
| Comparative end mill 12 | 0.6 | 0.7 | 0.7 | 1.5 | 0.5 | 0.2 | 2.5 | 90 |
| Comparative end mill 13 | 0.6 | 0.5 | 0.6 | 1.2 | 0.5 | 0.1* | 5.0* | 80 |
| Comparative end mill 14 | 0.7 | 0.4* | 0.5 | 1.0 | 0.6 | 0.5* | 1.2* | 90 |
| Comparative end mill 15 | 0.6 | 0.7 | 0.8 | | 0.5 | 0.2 | 2.5 | 0* |
| Comparative end mill 16 | 0.5 | | | 0.8 | 0.4 | 0.3 | 1.3* | 0* |
| Comparative end mill 17 | 0.6 | | | 1.5 | 0.5 | 0.2 | 2.5 | 0* |
| Comparative end mill 18 | 0.5 | | | | 0.4 | 0.4 | 1.0* | 0* |
| Comparative end mill 19 | 0.5 | 1.6* | 1.3 | 1.5 | 0.4 | 0.2 | 2.0 | 80 |
| Comparative end mill 20 | 0.7 | 1.7* | 1.6* | 1.5 | 0.6 | 0.2 | 3.0 | 80 |
| Comparative end mill 21 | 0.5 | 1.6* | 0.9 | 1.5 | 0.4 | 0.2 | 2.0 | 70 |
| Comparative end mill 22 | 0.6 | 1.8* | 0.7 | 1.5 | 0.5 | 0.2 | 2.5 | 70 |

TABLE 3-continued

| | | | | | | | | |
|---|---|---|---|---|---|---|---|---|
| Comparative end mill 23 | 0.5 | 0.6 | 0.5 | 1.5 | 0.4 | 0.2 | 2.0 | 80 |
| Comparative end mill 24 | 0.6 | 0.7 | 0.7 | 1.5 | 0.5 | 0.2 | 2.5 | 90 |
| Comparative end mill 25 | 0.6 | 0.8 | 0.8 | 1.5 | 0.5 | 0.2 | 2.5 | 90 |

| | Diamond film | | | |
|---|---|---|---|---|
| Kind | Average film thickness (μm) | Average grain size in region of 0.5 to 1.5 μm (μm) | Ratio of columnar crystals having growth direction at angle of 10 degrees or less with respect to thickness direction of diamond film (%) | <110> orientation ratio (%) |
| Present invention end mill 1 | 15 | 0.2 | 90 | 20* |
| Present invention end mill 2 | 12 | 0.2 | 90 | 20* |
| Present invention end mill 3 | 15 | 0.2 | 90 | 15* |
| Present invention end mill 4 | 16 | 0.2 | 90 | 20* |
| Present invention end mill 5 | 18 | 0.1 | 80* | 50 |
| Present invention end mill 6 | 15 | 0.1 | 80* | 60 |
| Present invention end mill 7 | 10 | 0.1 | 70* | 70 |
| Present invention end mill 8 | 8 | 0.1 | 80* | 70 |
| Present invention end mill 9 | 12 | 0.1 | 90 | 50 |
| Present invention end mill 10 | 14 | 0.2 | 90 | 40 |
| Present invention end mill 11 | 12 | 0.2 | 100 | 70 |
| Present invention end mill 12 | 28 | 0.1 | 100 | 40 |
| Present invention end mill 13 | 12 | 0.2 | 100 | 70 |
| Present invention end mill 14 | 13 | 0.1 | 95 | 50 |
| Present invention end mill 15 | 14 | 0.3 | 100 | 30 |
| Present invention end mill 16 | 3 | 0.1 | 90 | 50 |
| Present invention end mill 17 | 11 | 0.2 | 90 | 30 |
| Present invention end mill 18 | 7 | 0.3 | 90 | 50 |
| Present invention end mill 19 | 2** | 0.2 | 90 | 30 |
| Present invention end mill 20 | 32** | 0.2 | 90 | 50 |
| Comparative end mill 1 | 14 | 0.3 | 90 | 50 |
| Comparative end mill 2 | 24 | 0.1 | 90 | 30 |
| Comparative end mill 3 | 14 | 0.1 | 90 | 50 |
| Comparative end mill 4 | 13 | 0.2 | 80* | 30 |
| Comparative end mill 5 | 10 | 0.2 | 100 | 30 |
| Comparative end mill 6 | 8 | 0.2 | 70* | 40 |
| Comparative end mill 7 | 6 | 0.2 | 90 | 40 |
| Comparative end mill 8 | 10 | 0.1 | 90 | 30 |
| Comparative end mill 9 | 14 | 0.1 | 30* | 10* |
| Comparative end mill 10 | 10 | 0.2 | 90 | 80* |
| Comparative end mill 11 | 10 | 0.2 | 90 | 30 |
| Comparative end mill 12 | 14 | 0.2 | 100 | 40 |
| Comparative end mill 13 | 14 | 0.2 | 80* | 40 |
| Comparative end mill 14 | 10 | 0.2 | 90 | 50 |
| Comparative end mill 15 | | | | |
| Comparative end mill 16 | 18 | 0.2 | 80* | 30 |
| Comparative end mill 17 | 10 | 0.1 | 90 | 40 |
| Comparative end mill 18 | | | | |
| Comparative end mill 19 | 10 | 0.2 | 90 | 40 |
| Comparative end mill 20 | 14 | 0.2 | 80* | 30 |
| Comparative end mill 21 | 10 | 0.2 | 80* | 40 |
| Comparative end mill 22 | 14 | 0.2 | 90 | 40 |
| Comparative end mill 23 | 10 | 0.05* | 90 | 50 |
| Comparative end mill 24 | 10 | 0.4* | 30* | 50 |
| Comparative end mill 25 | 22 | 1.0<* | 30* | 50 |

(Note)
*in the columns indicates that the value is not included in the scopes defined by the instant claims.
**in the columns indicates that the value is not included in the scopes defined by the instant claims.

Next, using the present invention end mills 1 to 20 and comparative end mills 1 to 25 (all of which had an outer diameter of φ10.0 mm), a CFRP high-speed groove machining test was performed under the following conditions. The conventional cutting speed described in the following conditions is a cutting speed at which the efficiency (generally, the number of parts that can be machined until the tool life, and the like) is optimum in a case of using a coated tool in the related art.
Cutting speed: 300 m/min
Cutting conditions: Air blow
Overhang: 25 mm
Feed per tooth: 0.03 mm/tooth In the cutting test, when abnormal noise of cutting was generated and the load during cutting showed an abnormality, the test was interrupted, and the presence or absence of peeling/fracture was checked. In a case where peeling, fracture, or the like was confirmed, the machining length up to that point was taken as the machining life.

In addition, those in which fracturing had not occurred until the machining length became 25 m, the wear state of the flank face on the center of the cutting edge was normal (no fracture or chipping), and the length of burrs or the delamination width around the machined hole did not exceed 1 mm were regarded as an acceptable condition of the present invention end mills.

Table 4 shows the results of these evaluations.

TABLE 4

| Type | Cutting length (m) | Wear state |
|---|---|---|
| Present invention end mill 1 | 30 | Normal wear |
| Present invention end mill 2 | 30 | Normal wear |
| Present invention end mill 3 | 30 | Normal wear |
| Present invention end mill 4 | 30 | Normal wear |
| Present invention end mill 5 | 30 | Normal wear |
| Present invention end mill 6 | 30 | Normal wear |
| Present invention end mill 7 | 30 | Normal wear |
| Present invention end mill 8 | 30 | Normal wear |
| Present invention end mill 9 | 30 | Normal wear |
| Present invention end mill 10 | 30 | Normal wear |
| Present invention end mill 11 | 30 | Normal wear |
| Present invention end mill 12 | 30 | Normal wear |
| Present invention end mill 13 | 30 | Normal wear |
| Present invention end mill 14 | 30 | Normal wear |
| Present invention end mill 15 | 30 | Normal wear |
| Present invention end mill 16 | 30 | Normal wear |
| Present invention end mill 17 | 30 | Normal wear |
| Present invention end mill 18 | 30 | Normal wear |
| Present invention end mill 19 | 25 | Normal wear |
| Present invention end mill 20 | 25 | Normal wear |
| Comparative end mill 1 | <1 | Chipping |
| Comparative end mill 2 | 20 | Chipping |
| Comparative end mill 3 | <1 | Chipping |
| Comparative end mill 4 | 15 | Chipping |
| Comparative end mill 5 | 15 | Chipping |
| Comparative end mill 6 | 15 | Chipping |
| Comparative end mill 7 | 10 | Chipping |
| Comparative end mill 8 | 15 | Chipping |
| Comparative end mill 9 | 10 | Chipping |
| Comparative end mill 10 | 15 | Chipping |
| Comparative end mill 11 | <1 | Chipping |
| Comparative end mill 12 | 15 | Chipping |
| Comparative end mill 13 | 15 | Chipping |
| Comparative end mill 14 | 15 | Chipping |
| Comparative end mill 15 | <1 | Fracture |
| Comparative end mill 16 | <1 | Chipping |
| Comparative end mill 17 | <1 | Chipping |
| Comparative end mill 18 | <1 | Fracture |
| Comparative end mill 19 | 20 | Chipping |
| Comparative end mill 20 | 15 | Chipping |
| Comparative end mill 21 | 15 | Chipping |
| Comparative end mill 22 | 20 | Chipping |
| Comparative end mill 23 | 15 | Chipping |
| Comparative end mill 24 | 15 | Chipping |
| Comparative end mill 25 | 5 | Chipping |

From the results shown in Table 4, it can be seen that in the present invention end mills, both the Co content in the body and the average particle size of the WC particles were within the predetermined ranges, the maximum height difference between the concave and convex of the body interface contacting with the diamond film or the maximum distance between the concave and convex and the length in the thickness direction of the diamond film in the region in which the binder phase of the body was removed were respectively within the predetermined ranges, 70 area % or more of the WC particles at the interface satisfied in the predetermined range the maximum value of the vertex-to-vertex distances and the diameter of the inscribed-circle inscribed therein or the minimum value of the distances between the tangents of the opposing faces, (maximum value of vertex-to-vertex distances of WC particles at body interface)/(diameter of inscribed-circle inscribed in WC particle or minimum value of distances between tangents of opposing faces), in addition, the average film thickness of the diamond film, the maximum height difference between the concave and convex, and the average grain size of the diamond crystals in the range of 0.5 to 1.5 μm from the body interface satisfied the predetermined values, and in the diamond columnar crystals at least one of the ratio of the crystals at an angle in the predetermined range with respect to the film thickness direction or the <110> orientation ratio satisfied the predetermined value, so that adhesion and smoothness of the diamond film could be secured and excellent chipping resistance and wear resistance were exhibited. Therefore, the cutting tools made of diamond-coated cemented carbide of the present invention were improved in tool life for hard-to-cut materials such as CFRP. Contrary to this, it can be seen that comparative end mills which lacked one or more items to be satisfied by the cutting tools made of diamond-coated cemented carbide of the present invention could not secure adhesion and smoothness of the diamond film, and thus had a short cutting length, chipping occurred, and a short tool life.

INDUSTRIAL APPLICABILITY

The cutting tool made of diamond-coated cemented carbide of the present invention can be applied not only to end mills made of diamond-coated cemented carbide, but also to various diamond-coated tools such as inserts made of diamond-coated cemented carbide and drills made of diamond-coated cemented carbide. For this reason, since the cutting tool made of diamond-coated cemented carbide of the present invention exhibits excellent edge tip strength and wear resistance, the cutting tool made of diamond-coated cemented carbide of the present invention can satisfactorily cope with energy saving during cutting and a further reduction in costs, and thus the industrial applicability thereof is extremely large.

REFERENCE SIGNS LIST 1 cemented carbide body
1a WC particle
1b binder phase
2 diamond film
2a diamond film growth late stage
2b diamond film growth initial stage
3 interface between cemented carbide body and diamond film

The invention claimed is:
1. A diamond-coated cemented carbide cutting tool comprising:
a WC-based cemented carbide body containing 3 to 15 mass % of Co that is coated with a diamond film,
wherein, in a cross section of the diamond-coated cemented carbide cutting tool in a diamond film thickness direction,
(1) an average particle size of WC particles constituting the WC-based cemented carbide body is 0.5 to 0.9 μm,
(2) a maximum height difference ($R_z$) of concave and convex of an interface of the WC-based cemented carbide body contacting the diamond film is 0.5 to 1.0 μm, a maximum distance (Δ) between adjacent concave and convex of the WC-based cemented carbide body at the interface is 0.5 to 1.5 μm, and a length ($Y_e$) of the diamond film in the thickness direction in a region where a binder phase of the WC-based cemented carbide body is removed is 0.5 to 2.0 μm,
(3) when a sum of areas occupied by individual WC particles contacting the diamond film at the interface is defined as 100 area %, a sum of areas of WC particles, which satisfies a maximum value ($L_1$) of vertex-to- vertex distances of the WC particles at a body interface being 0.4 to 0.8 μm, a minimum value ($L_2$) of a diameter of an inscribed-circle inscribed in the WC particle or distances between tangents of opposing faces being 0.2 to 0.4 μm, and ($L_1$)/($L_2$) being 1.5 to 2.5, is 70 area % or more, (4) an average grain size of diamond crystals in a region of 0.5 to 1.5 μm from the WC-based cemented carbide body interface toward the diamond film is 0.1 to 0.3 μm, and (5) the diamond-coated cemented carbide cutting tool comprises columnar crystals, which contact the top of the diamond crystals and constitute the diamond film, the columnar crystals satisfy at least one of: a ratio of crystals, which has a growth direction shifted in 10 degrees or less from the diamond film thickness direction, being 90% or more; and an orientation ratio of <110> being 30 to 70%.

2. The diamond-coated cemented carbide cutting tool according to claim 1, wherein an average film thickness of the diamond film is 3 to 30 μm.

\* \* \* \* \*